(12) United States Patent
Kakuno et al.

(10) Patent No.: US 9,099,386 B2
(45) Date of Patent: Aug. 4, 2015

(54) LASER ANNEALING METHOD, LASER ANNEALING APPARATUS, AND METHOD FOR MANUFACTURING THIN FILM TRANSISTOR

(71) Applicant: Kabushiki Kaisha Toshiba, Tokyo (JP)

(72) Inventors: Tsutomu Kakuno, Kanagawa-ken (JP); Ryuichi Togawa, Tokyo (JP); Hiroshi Ito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 13/785,400

(22) Filed: Mar. 5, 2013

(65) Prior Publication Data

US 2013/0244347 A1    Sep. 19, 2013

(30) Foreign Application Priority Data

Mar. 14, 2012  (JP) .................. 2012-057269

(51) Int. Cl.
| | |
|---|---|
| *H01L 21/20* | (2006.01) |
| *H01L 21/263* | (2006.01) |
| *B23K 26/00* | (2014.01) |
| *B23K 26/073* | (2006.01) |
| *B23K 26/08* | (2014.01) |
| *C30B 1/02* | (2006.01) |
| *C30B 28/08* | (2006.01) |
| *C30B 29/06* | (2006.01) |

(Continued)

(52) U.S. Cl.
CPC ........ *H01L 21/2636* (2013.01); *B23K 26/0066* (2013.01); *B23K 26/0738* (2013.01); *B23K 26/083* (2013.01); *C30B 1/02* (2013.01); *C30B 1/023* (2013.01); *C30B 28/08* (2013.01); *C30B 29/06* (2013.01); *C30B 35/00* (2013.01); *H01L 21/268* (2013.01)

(58) Field of Classification Search
USPC ................ 438/487, 7, 10, 16, 17, 797
See application file for complete search history.

(56) References Cited

U.S. PATENT DOCUMENTS 6,372,039 B1 *    4/2002    Okumura et al. ................ 117/8

FOREIGN PATENT DOCUMENTS

| JP | 10-92763 | 4/1998 |
|---|---|---|
| JP | 11-278688 | 10/1999 |

(Continued)

OTHER PUBLICATIONS

Japanese Office Action issued Dec. 24, 2013, in Japan Patent Application No. 2012-057269 (with English translation).

(Continued)

*Primary Examiner* — Reema Patel
(74) *Attorney, Agent, or Firm* — Oblon, McClelland, Maier & Neustadt, L.L.P.

(57) ABSTRACT

According to one embodiment, a laser annealing method includes: detecting an intensity distribution of a laser light formed as a line beam by a line beam optical system; dividing width in short axis direction of the line beam in the detected intensity distribution by number of times of the irradiation per one site and partitioning the width; and calculating increment of crystal grain size of a non-crystalline thin film for energy density corresponding to wave height of the partitioned intensity distribution, and summing the increments by number of times of pulse irradiation, when energy density of the laser light is larger than a threshold, the crystal grain size of the non-crystalline thin film taking a downward turn at the threshold, the increment summed before the energy density exceeds the threshold being set to zero.

13 Claims, 15 Drawing Sheets

(51) Int. Cl.
*C30B 35/00* (2006.01)
*H01L 21/268* (2006.01)

(56) References Cited

FOREIGN PATENT DOCUMENTS

| JP | 2001-338893 | 12/2001 |
|---|---|---|
| JP | 2002-33293 | 1/2002 |
| JP | 2003-258349 | 9/2003 |

OTHER PUBLICATIONS

Office Action issued on Jan. 8, 2014 in the counterpart Korean Patent Application No. 10-2013-27478 (with English Translation).

* cited by examiner

LASER ANNEALING METHOD, LASER ANNEALING APPARATUS, AND METHOD FOR MANUFACTURING THIN FILM TRANSISTOR

CROSS-REFERENCE TO RELATED APPLICATIONS

This application is based upon and claims the benefit of priority from the prior Japanese Patent Application No. 2012-057269, filed on Mar. 14, 2012; the entire contents of which are incorporated herein by reference.

FIELD

Embodiments described herein relate generally to a laser annealing method, a laser annealing apparatus, and a method for manufacturing thin film transistor.

BACKGROUND

There is a laser annealing method in which a non-crystalline thin film is irradiated with laser light and modified. For instance, in a liquid crystal display (LCD) currently in volume production, an insulated gate thin film transistor (TFT) based on amorphous silicon (a-Si) is used as a pixel switch. However, realization of a display with high functionality such as high definition and high speed is beyond the capability of the TFT based on a-Si having an electric field mobility ($\mu$FE) as low as 1 cm$^2$/Vs or less.

On the other hand, in another laser annealing method, a-Si is irradiated with excimer laser to form polycrystalline silicon for use in TFT. In such TFT, in the experimental stage, $\mu$FE has attained approximately 100-200 cm$^2$/Vs. Thus, higher functionality such as higher definition and higher speed of display, and integral formation of driving circuits can be expected.

However, the energy density (fluence) of the irradiating laser beam may be varied. Due to this variation, grains outside the desired grain size are formed in the polycrystalline silicon obtained after annealing. This causes the problem of variation in the grain size of polycrystalline silicon. Furthermore, there is no defined value for detecting whether grains outside the desired grain size occur for a particular intensity distribution of the laser beam.

DETAILED DESCRIPTION

Figure 1:
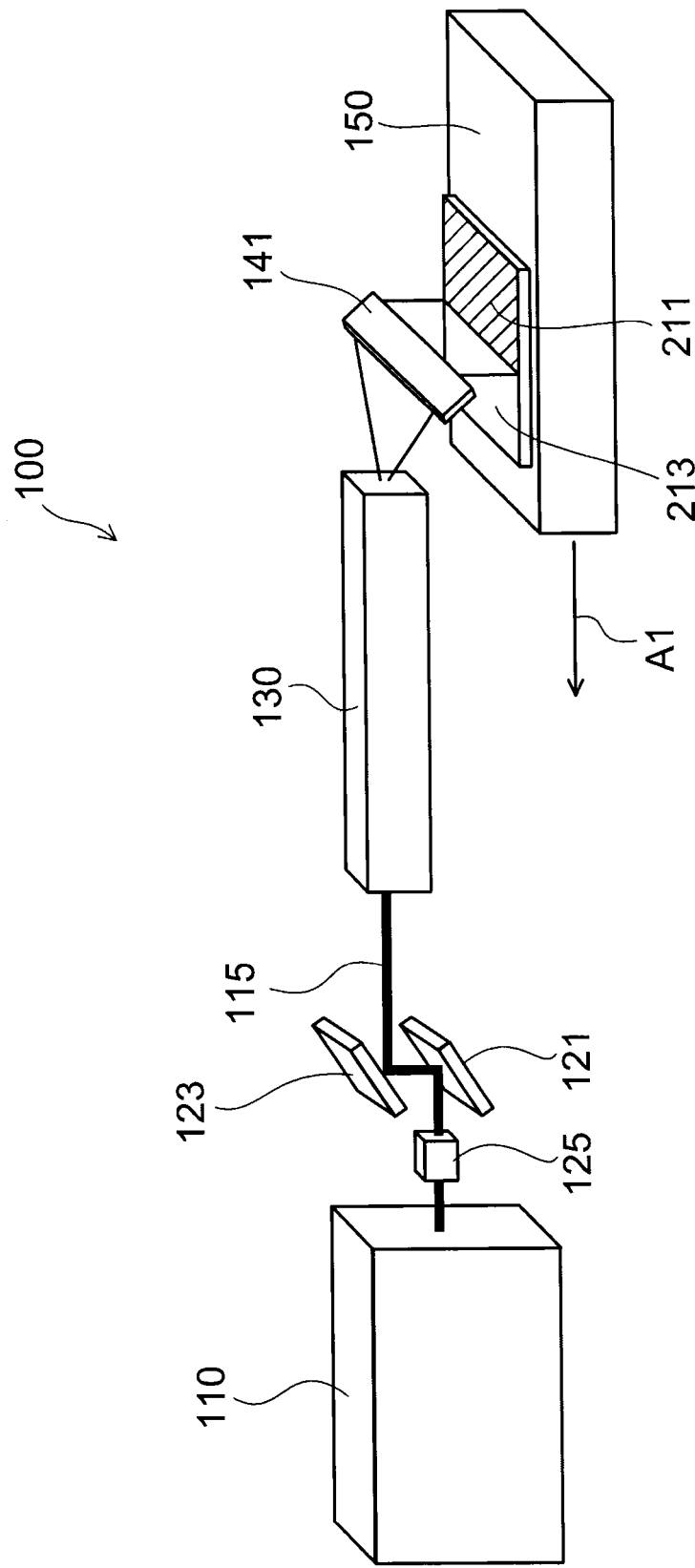
FIG. 1 is a schematic perspective view showing the overview of a laser annealing apparatus according to an embodiment of the invention.

In general, according to one embodiment, a laser annealing method for irradiating a non-crystalline thin film with laser light to modify the non-crystalline thin film, includes: detecting an intensity distribution of the laser light emitted from a laser apparatus and formed as a line beam by a line beam optical system; dividing width in short axis direction of the line beam in the detected intensity distribution by number of times of the irradiation per one site and partitioning the width; and calculating increment of crystal grain size of the non-crystalline thin film for energy density corresponding to wave height of the partitioned intensity distribution, and summing the increments by number of times of pulse irradiation, when energy density of the laser light is larger than a threshold, the crystal grain size of the non-crystalline thin film taking a downward turn at the threshold, the increment summed before the energy density exceeds the threshold being set to zero.

Embodiments of the invention will now be described with reference to the drawings. In the drawings, similar components are labeled with like reference numerals, and the detailed description thereof is omitted appropriately.

FIG. 1 is a schematic perspective view showing the overview of a laser annealing apparatus according to an embodiment of the invention.

Figure 2:
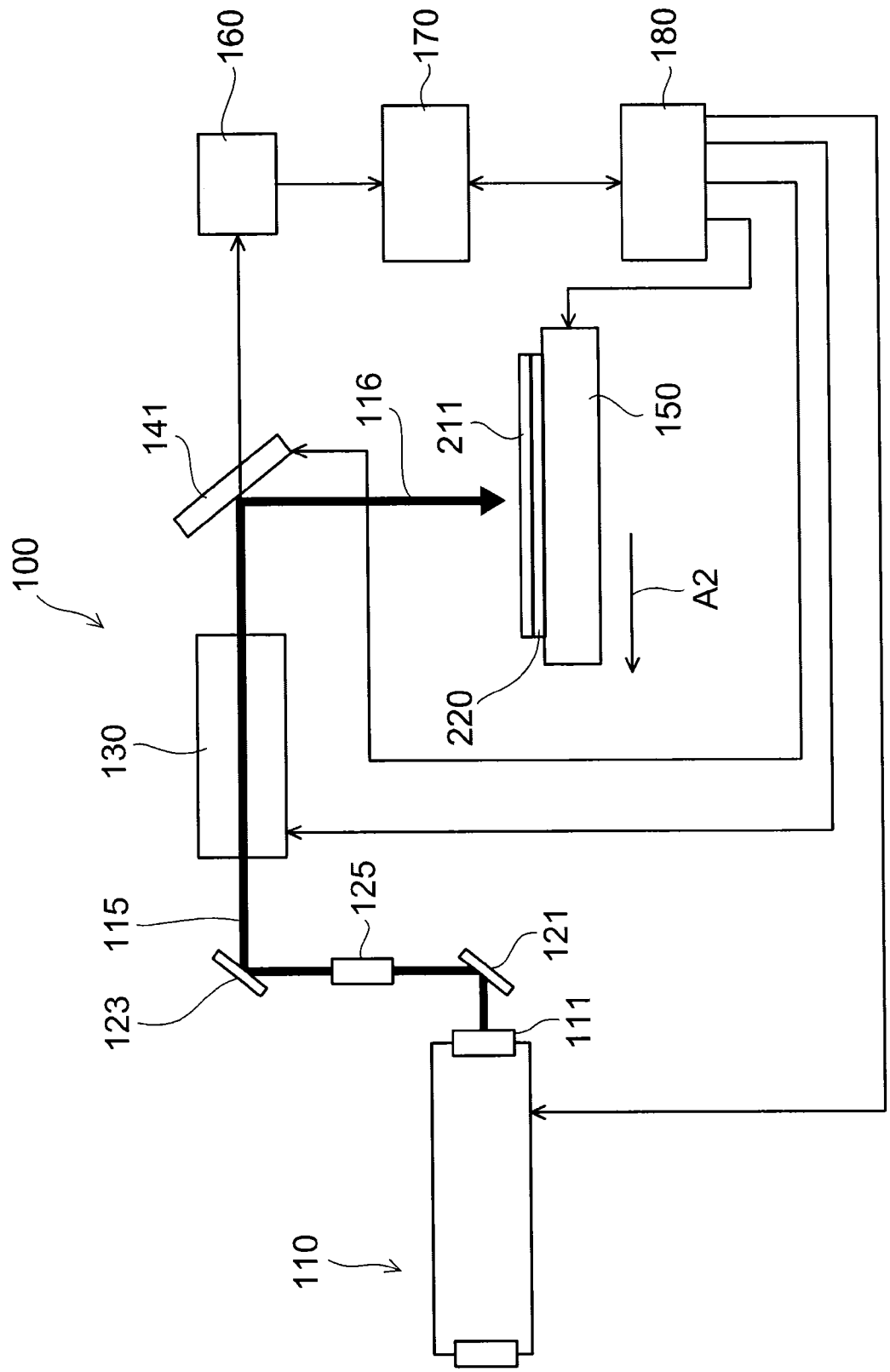
FIG. 2 is a block diagram showing the laser annealing apparatus according to this embodiment.

FIG. 2 is a block diagram showing the laser annealing apparatus according to this embodiment.

As shown in FIG. 1, the laser annealing apparatus 100 according to this embodiment includes a laser apparatus 110, a first reflecting mirror 121, a second reflecting mirror 123, a line beam optical system 130, a third reflecting mirror 141, an attenuator 125 for adjusting the energy (intensity) of laser light 115 emitted out from the laser apparatus 110, and a mounting stage 150. The first reflecting mirror 121 and the second reflecting mirror 123 do not necessarily need to be provided. The laser light 115 emitted from the laser apparatus 110 may be directly incident on the line beam optical system 130. The energy may be adjusted not by the attenuator 125, but by the laser apparatus 110 itself.

As shown in FIG. 2, the laser annealing apparatus 100 according to this embodiment includes a detector (profile monitor) 160, a first control apparatus (profile control PC) 170, and a second control apparatus (host control PC) 180.

The laser apparatus 110 includes e.g. a resonator, not shown. The laser apparatus 110 can emit pulse laser (e.g., excimer laser) light with a frequency of e.g. approximately 100-300 hertz (Hz). However, the laser of the laser apparatus 110 is not limited to excimer laser. The laser light 115 emitted from the laser apparatus 110 is reflected by the first reflecting mirror 121 and the second reflecting mirror 123, and is incident on the line beam optical system 130.

As described later, the line beam optical system 130 includes e.g. a plurality of cylindrical lens arrays. The line beam optical system 130 can form a line beam in which the intensity distribution in the long axis direction (direction perpendicular to the scan direction) and the intensity distribution in the short axis direction (scan direction) are made generally uniform. The laser light 116 emitted from the line beam optical system 130 is reflected by the third reflecting mirror 141. As shown in FIG. 2, the laser light 116 is applied to a substrate 220 with a non-crystalline silicon (amorphous silicon) film 211 formed on the surface thereof.

In this specification, "non-crystalline" includes not only completely non-crystalline in the crystallographic sense, but also e.g. those including fine crystal grains in a non-crystalline matrix, and those having a short-period ordered structure close to being non-crystalline.

In this specification, "modification" includes turning a non-crystalline thing into a crystal, and/or enlarging or growing a crystal grain in a crystalline thing.

Thus, the laser annealing method of this embodiment can be used not only to modify a non-crystalline silicon film into a polycrystalline silicon film, but also to grow crystal grains in a polycrystalline silicon film to modify it into a polycrystalline silicon film with higher crystallinity. Furthermore, the laser annealing method of this embodiment is not limited to silicon film, but is applicable to crystal films in general. That is, the laser annealing method of this embodiment is applicable to e.g. modifying a non-crystalline film into a polycrystalline film, and growing crystal grains in a polycrystalline film to modify it into a polycrystalline film with higher crystallinity.

The substrate 220 with the non-crystalline silicon film 211 formed on the surface thereof is mounted on the mounting stage 150. The position of the mounting stage 150 is controlled by the second control apparatus 180. The non-crystalline silicon film 211 formed on the surface of the substrate 220 is pulse-irradiated with the laser light 115 at a prescribed frequency while the mounting stage 150 is moved as arrow A1 shown in FIG. 1 or arrow A2 shown in FIG. 2. Thus, laser annealing is performed. That is, as shown in FIG. 1, the non-crystalline silicon film 211 is irradiated with the laser light 115 formed as a line beam, and thereby modified into a polycrystalline silicon (polysilicon) film 213.

As shown in FIG. 2, the third reflecting mirror 141 can transmit part of the laser light 115 emitted from the line beam optical system 130 and guide it to the detector 160. The detector 160 detects the intensity distribution of the laser light 115 transmitted through the third reflecting mirror 141. The detector 160 then sends a signal of the intensity distribution to the first control apparatus 170. The first control apparatus 170 can predict a process result from the signal of the intensity distribution sent from the detector 160. The first control apparatus 170 can then detect a state in which there is a high probability that grains outside the desired grain size of the polycrystalline silicon film 213 occur. In other words, the first control apparatus 170 can process the signal of the intensity distribution sent from the detector 160, predict a process state, and determine whether the polycrystalline silicon film 213 is defective or non-defective.

The first control apparatus 170 sends a signal of the detection result or determination result to the second control apparatus 180. In the case where the first control apparatus 170 has sent a signal of abnormality determination to the second control apparatus 180, the second control apparatus 180 controls a prescribed action such as adjusting the line beam optical system 130, adjusting the tilt angle of the laser apparatus 110 or at least one of the first reflecting mirror 121 and the second reflecting mirror 123 to change the incident angle of the laser light 115 on the line beam optical system 130, raising an alarm, and stopping the laser annealing apparatus 100. Here, the determination of abnormality may be performed by the second control apparatus 180 instead of the first control apparatus 170. In this case, based on the signal sent from the first control apparatus 170, the second control apparatus 180 determines whether the polycrystalline silicon film 213 is defective or non-defective, and controls a prescribed action such as those described above.

The algorithm in the first control apparatus 170 and the second control apparatus 180 will be described later in detail. The second control apparatus 180 may have the function of the first control apparatus 170.

Thus, in the laser annealing apparatus 100 of this embodiment, the intensity distribution of the laser light 115 can be processed to predict a process result, which can be fed back to the process. Thus, the decrease of yield due to failures in the process can be suppressed.

Next, the line beam laser light 116 is described with reference to the drawings.

Figure 3:
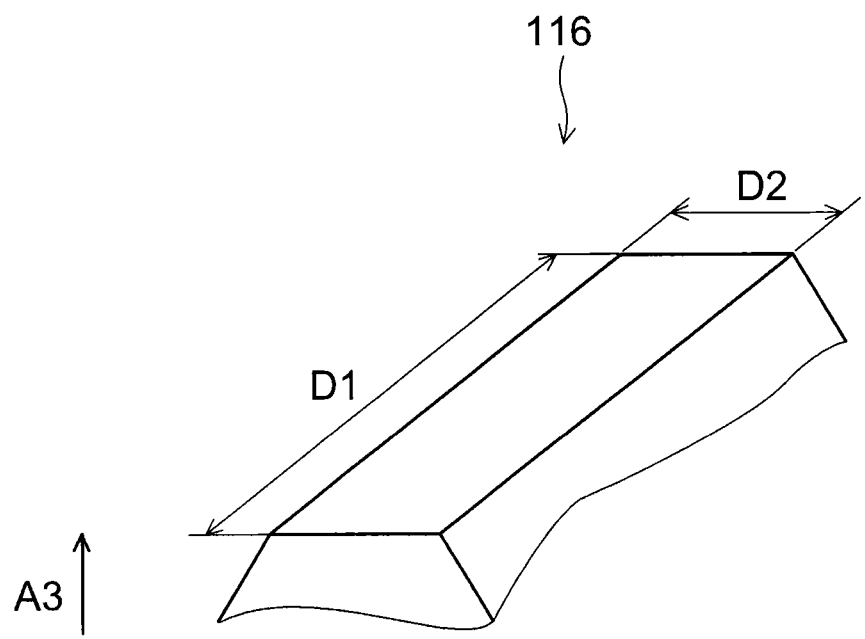
FIG. 3 is a schematic perspective view showing the irradiation size of the laser light of this embodiment.

FIG. 3 is a schematic perspective view showing the irradiation size of the laser light of this embodiment.

Figure 4:
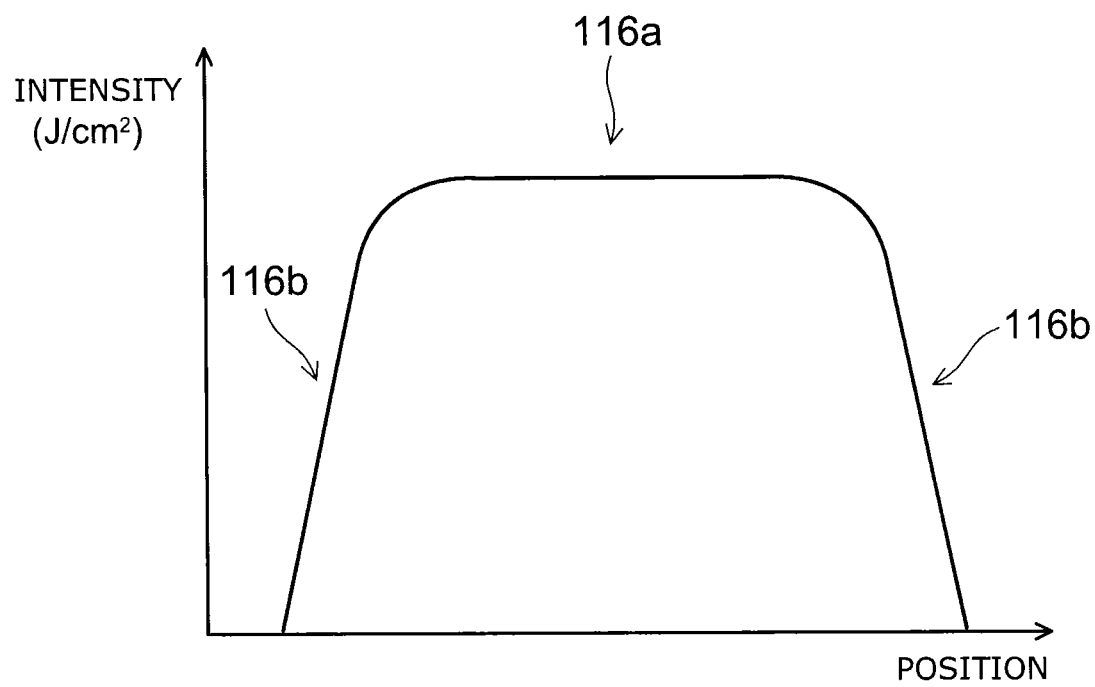
FIG. 4 is a graph illustrating an example of the regular intensity distribution in the short axis direction of the laser light of this embodiment.

FIG. 4 is a graph illustrating an example of the regular intensity distribution in the short axis direction of the laser light of this embodiment.

Figure 5:
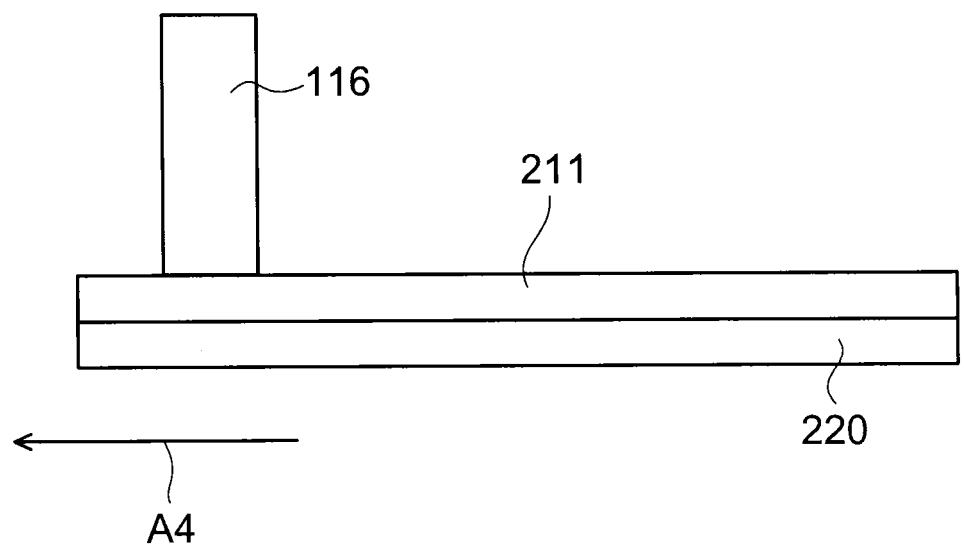
FIG. 5 is a schematic plan view showing the state of the non-crystalline silicon being scan-irradiated.

FIG. 5 is a schematic plan view showing the state of the non-crystalline silicon being scan-irradiated.

The horizontal axis of the graph shown in FIG. 4 represents position in the short axis direction of the laser light. The vertical axis of the graph shown in FIG. 4 represents the intensity of the laser light.

As shown in FIG. 3, with regard to the irradiation size of the laser light 116 formed as a line beam of this embodiment, the dimension D1 in the long axis direction is e.g. approximately 350 millimeters (mm) or more. The dimension D2 in the short axis direction is e.g. approximately 0.2-0.4 mm. The shape of the laser light 116 in the direction of arrow A3 shown in FIG. 3 schematically shows the intensity distribution of the laser light 116.

More specifically, as shown in FIG. 4, the intensity distribution in the short axis direction of the laser light 116 of this embodiment has a portion including the top and called e.g. plateau 116a, and a hem portion with decreasing intensity and called e.g. steepness 116b. The steepness 116b exists on both sides of the intensity distribution.

As shown in FIG. 4, the third reflecting mirror 141, the line beam optical system 130 and the like are appropriately adjusted so that the intensity in the plateau 116a is made generally constant independent of the position along the short axis direction. In other words, in the case where the intensity distribution of the laser light 116 has a regular intensity distribution, or at the early stage in which the laser light 115 is emitted from the laser apparatus 110, the intensity in the plateau 116a is generally constant independent of the position along the short axis direction.

Then, as indicated by arrow A4 shown in FIG. 5, the substrate 220 is moved. Thus, the non-crystalline silicon film 211 formed on the surface of the substrate 220 is scan-irradiated with the line beam laser light 116. For instance, the dimension D2 in the short axis direction is 0.4 mm. The non-crystalline silicon film 211 is scan-irradiated at a spacing (feed pitch) of 20 micrometers (μm) based on the moving speed of the mounting stage 150 and the frequency of the pulse-irradiating laser light 116. In this case, pulse irradiation is performed 20 times per one site. Thus, the non-crystalline silicon film 211 is polycrystallized.

However, even if the third reflecting mirror 141, the line beam optical system 130 and the like are appropriately adjusted, a deviation may occur in the intensity distribution in the short axis direction of the laser light 116. Specifically, for instance, the intensity in the plateau 116a may change depending on the position along the short axis direction. This is further described with reference to the drawings.

Figure 6:
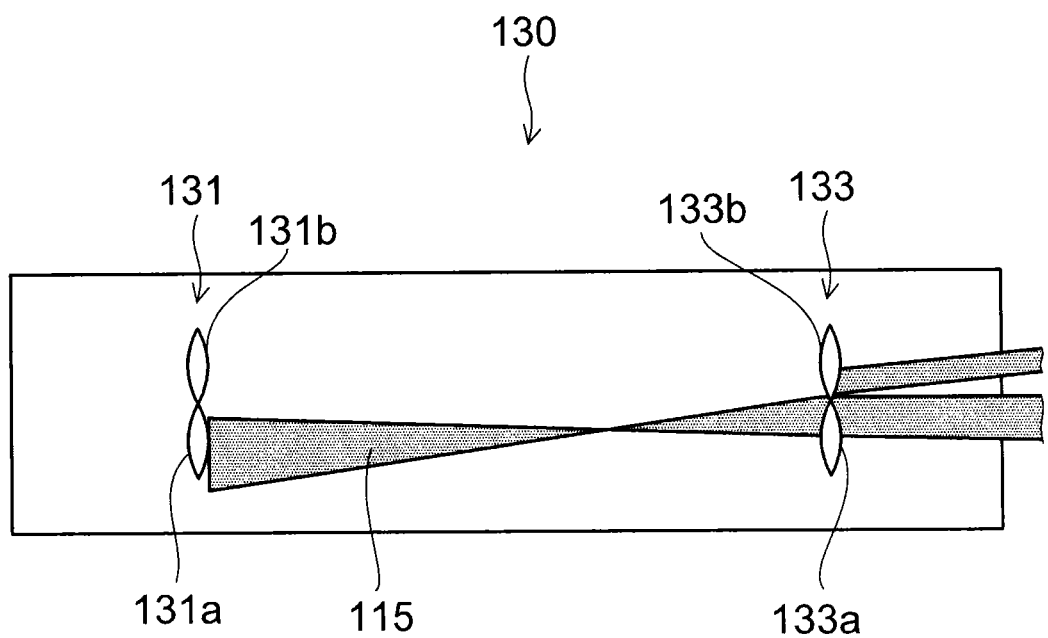
FIG. 6 is a schematic plan view illustrating the internal structure of the line beam optical system of this embodiment.

FIG. 6 is a schematic plan view illustrating the internal structure of the line beam optical system of this embodiment.

Figure 7A:
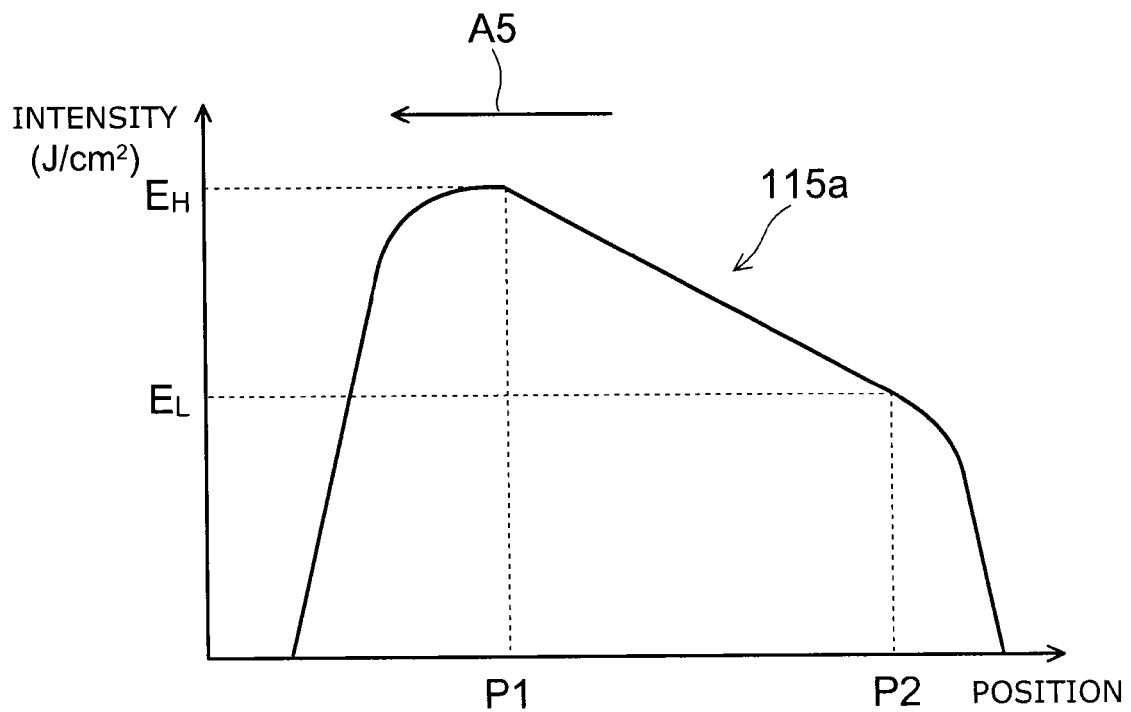
FIGS. 7A and 7B are graphs illustrating examples of irregular intensity distribution in the short axis direction of the laser light.
Figure 7B:
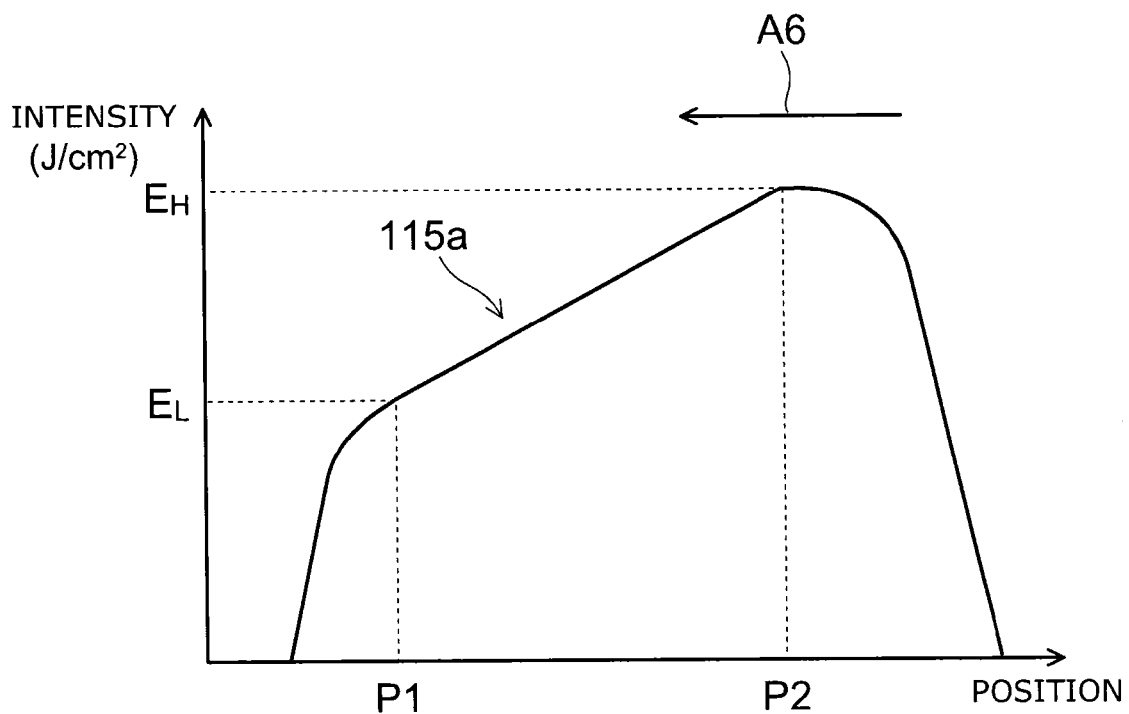

FIGS. 7A and 7B are graphs illustrating examples of irregular intensity distribution in the short axis direction of the laser light.

Here, arrow A5 shown in FIG. 7A and arrow A6 shown in FIG. 7B represent the moving direction of the mounting stage 150. The horizontal axis and vertical axis of the graphs shown in FIGS. 7A and 7B are similar to the horizontal axis and vertical axis of the graph shown in FIG. 4, respectively.

As shown in FIG. 6, the line beam optical system 130 of this embodiment includes a first cylindrical lens 131 and a second cylindrical lens 133. The first cylindrical lens 131 is placed on the incidence side as viewed from the second cylindrical lens 133. The first cylindrical lens 131 includes a first single lens 131a and a second single lens 131b. The second cylindrical lens 133 includes a first single lens 133a and a second single lens 133b. That is, the first cylindrical lens 131 and the second cylindrical lens 133 each have a structure in which a plurality of single lenses are arranged in parallel.

As shown in FIG. 2, the laser apparatus 110 includes an output mirror 111. The laser light 115 is emitted to the outside of the laser apparatus 110 through the output mirror 111, and is incident on the line beam optical system 130. Here, investigations by the inventor have revealed the following. Part of the laser light 115 transmitted through the output mirror 111 is absorbed by the output mirror 111 and converted to heat. Then, the refractive index of the output mirror 111, or the refractive index of the portion of the output mirror 111 having absorbed part of the laser light 115, is changed by heat. Accordingly, the output mirror 111 may produce the same effect as a lens (thermal lens effect).

If the output mirror 111 produces the same effect as a lens by the thermal lens effect, the incident angle and spread angle of the laser light 115 emitted from the laser apparatus 110 on the line beam optical system 130 are changed. Then, as shown in FIG. 6, the laser light 115 emitted out from the first single lens 131a of the first cylindrical lens 131 may be incident on not only the first single lens 133a but also the second single lens 133b of the second cylindrical lens 133. In this case, the beam shape of the laser light 116 is changed. Then, as shown in FIGS. 7A and 7B, the intensity distribution in the short axis direction of the laser light is changed relative to the regular intensity distribution (see FIG. 4).

In other words, as shown in FIG. 7A, the intensity in the plateau 116a is gradually decreased in the direction opposite to the moving direction (the direction of arrow A5) of the mounting stage 150. Specifically, the intensity $E_H$ of the laser light 116 at a first position P1 is higher than the intensity $E_L$ of the laser light 116 at a second position P2 located backward from the first position P1 as viewed in the moving direction of the mounting stage 150.

Alternatively, as shown in FIG. 7B, the intensity in the plateau 116a is gradually increased in the direction opposite to the moving direction (the direction of arrow A6) of the mounting stage 150. Specifically, the intensity $E_L$ of the laser light 116 at a first position P1 is lower than the intensity $E_H$ of the laser light 116 at a second position P2 located backward from the first position P1 as viewed in the moving direction of the mounting stage 150.

If the intensity in the plateau 116a is changed depending on the position along the short axis direction, grains outside the desired grain size may occur in the polycrystalline silicon film 213 and cause variation in the crystal grain size of the polycrystalline silicon film 213. This is further described with reference to the drawings.

Figure 8:
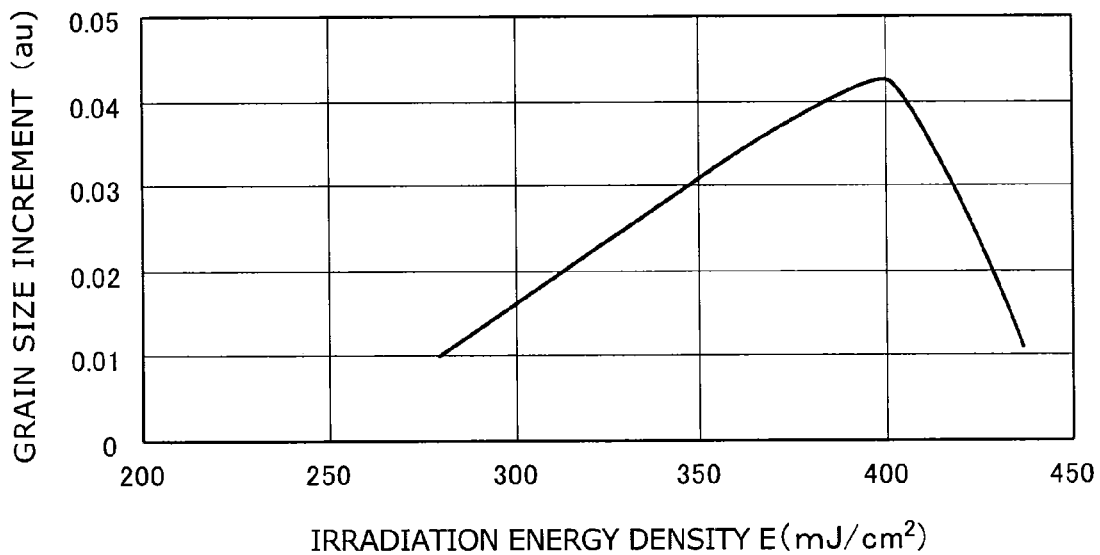
FIG. 8 is a graph illustrating the relationship between the energy density of laser light and the increment of crystal grain size increased by one time of pulse irradiation.

FIG. 8 is a graph illustrating the relationship between the energy density of laser light and the increment of crystal grain size increased by one time of pulse irradiation.

Figure 9:
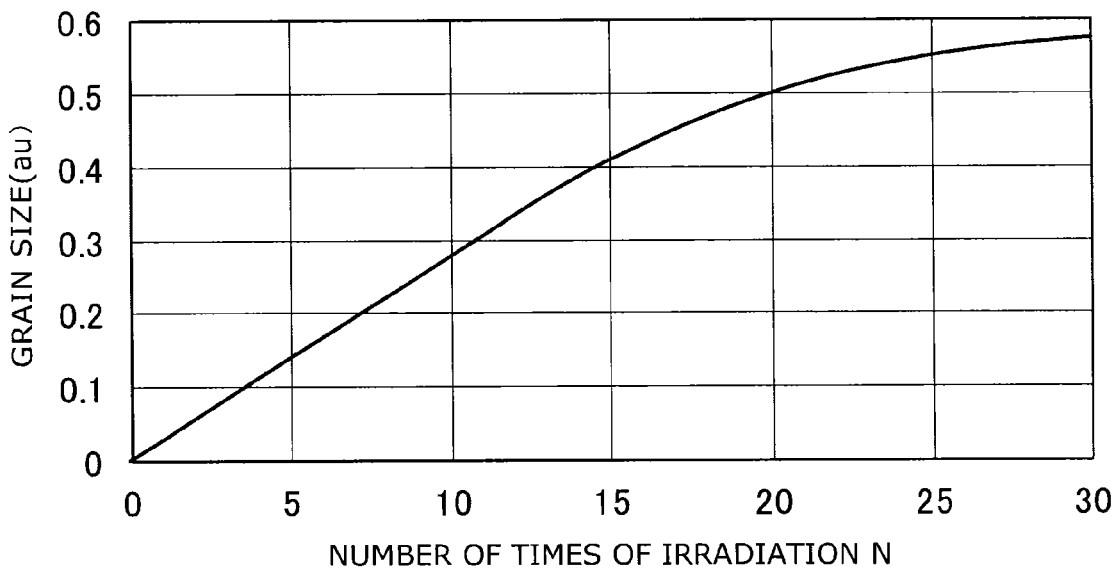
FIG. 9 is a graph illustrating the relationship between the number of times of irradiation and the crystal grain size.

FIG. 9 is a graph illustrating the relationship between the number of times of irradiation and the crystal grain size.

Here, FIG. 9 is a graph illustrating the relationship between the number of times of irradiation and the crystal grain size in the case where the energy density of the laser light 116 is 400 mJ/cm$^2$.

As shown in FIG. 8, the crystal grain size of the polycrystalline silicon film 213 modified from the non-crystalline silicon film 211 by irradiation with the laser light 116 depends on the energy density, called e.g. fluence, of the irradiating laser light 116. More specifically, with the increase of the energy density of the irradiating laser light 116, the amount of increase (increment) of the crystal grain size of the polycrystalline silicon film 213 per one time of pulse irradiation is increased. As shown in FIG. 9, with the increase of the number of times of pulse irradiation, the crystal grain size of the polycrystalline silicon film 213 is increased. If the number of times of pulse irradiation is further increased, the crystal grain size of the polycrystalline silicon film 213 is not proportional to the number of times of pulse irradiation, but is gradually saturated. The graphs shown in FIGS. 8 and 9 are illustrative only, and change with e.g. the film thickness, film quality, and film formation temperature of the non-crystalline silicon film 211.

Thus, by using the graphs shown in FIGS. 8 and 9, the crystal grain size of the polycrystalline silicon film 213 after irradiation with the laser light 116 can be predicted based on the energy density and the number of times of irradiation.

However, as shown in FIG. 8, if the energy density of the laser light 116 exceeds a prescribed energy density (approximately 390-410 mJ/cm$^2$ in the example shown in FIG. 8), the crystal grain size of the polycrystalline silicon film 213 takes a downward turn. That is, the polycrystalline silicon film 213 turns to include microcrystal grains. Thus, after pulse irradiation is performed a prescribed number of times, the desired crystal grain size of the polycrystalline silicon film 213 may not be obtained. In such microcrystalline silicon, the desired electric field mobility cannot be obtained.

In contrast, the laser annealing apparatus 100 according to this embodiment can perform an algorithm for setting the increment of crystal grain size summed so far to 0 (zero) when the energy density of the laser light 116 exceeds a prescribed energy density. Then, the laser annealing apparatus 100 can perform an algorithm for summing again the increment of crystal grain size based on the energy density less than or equal to the prescribed energy density and the remaining number of times of irradiation to predict the crystal grain size of the polycrystalline silicon film 213 after irradiation with the laser light 116.

Thus, the laser annealing apparatus 100 according to this embodiment can predict the crystal grain size of the polycrystalline silicon film 213 after irradiation with the laser light 116 even in the case where the energy density of the laser light 116 exceeds a prescribed energy density. Then, the laser annealing apparatus 100 can perform a defectiveness determination on the crystal grain size of the polycrystalline silicon film 213 after irradiation with the laser light 116. This algorithm (laser annealing method) is further described with reference to the drawings.

Figure 10:
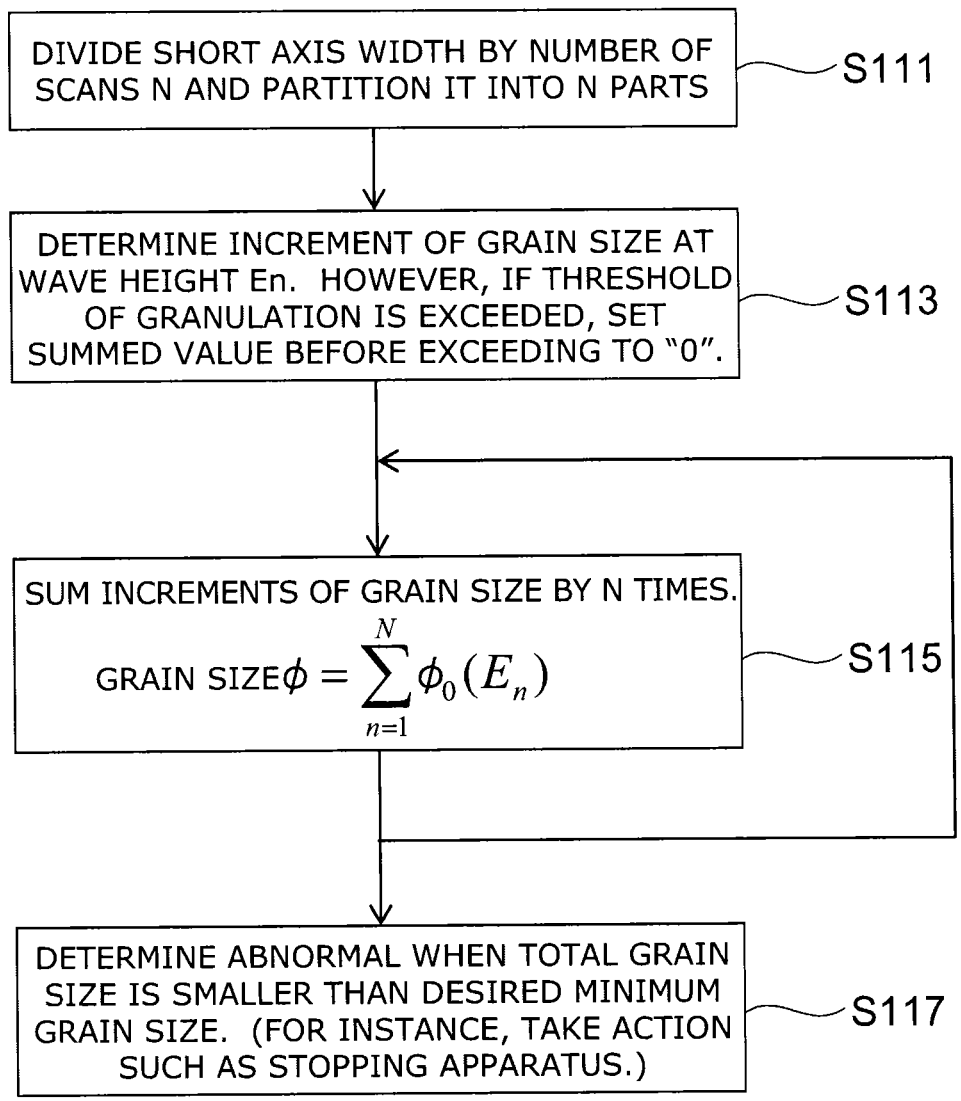
FIG. 10 is a flow chart describing the laser annealing method according to this embodiment.

FIG. 10 is a flow chart describing the laser annealing method according to this embodiment.

Figure 11:
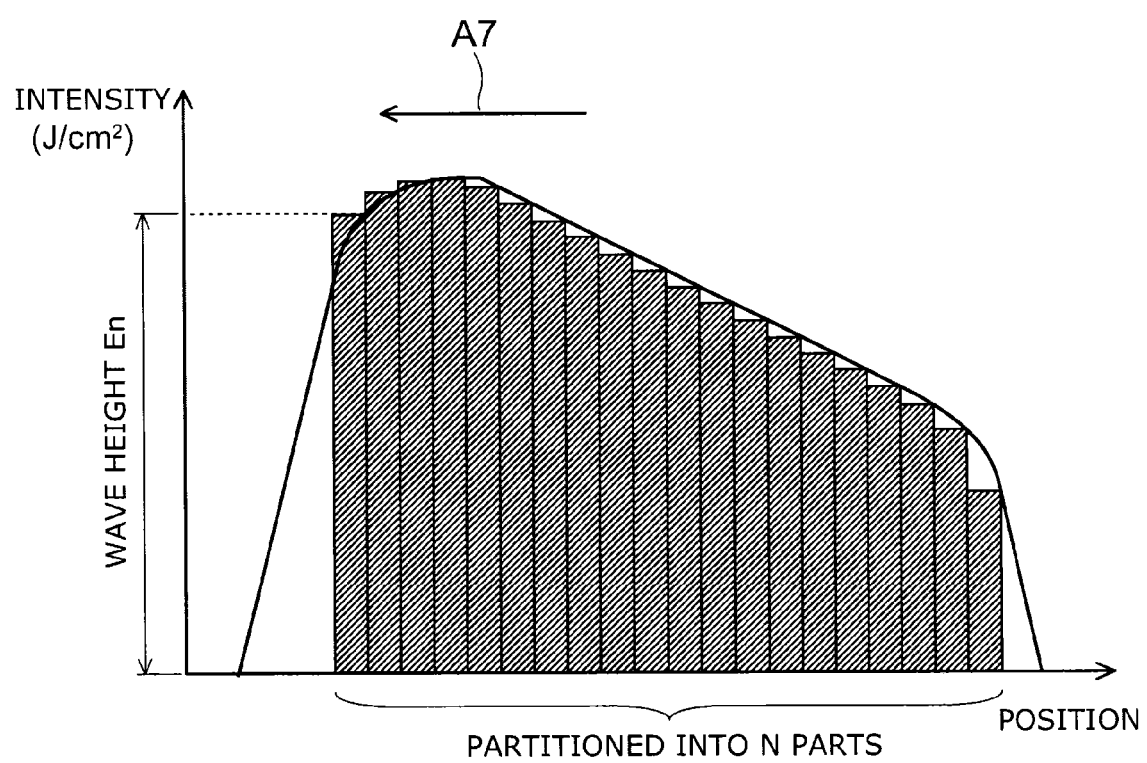
FIG. 11 is a graph illustrating an example with the intensity distribution in the short axis direction of the laser light partitioned into N parts.

FIG. 11 is a graph illustrating an example with the intensity distribution in the short axis direction of the laser light partitioned into N parts.

The horizontal axis and vertical axis of the graph shown in FIG. 11 are similar to the horizontal axis and vertical axis of the graph shown in FIG. 4, respectively.

As shown in FIG. 11, the first control apparatus 170 divides the width in the short axis direction of the intensity distribution sent from the detector 160 by the number of scans N, and partitions it into N parts (step S111). The number of scans N refers to the number of times of pulse irradiation per one site of the non-crystalline silicon film 211. For instance, in the case where pulse irradiation is performed 20 times per one site of the non-crystalline silicon film 211, the number of scans N is 20. In this case, the first control apparatus 170 partitions the width in the short axis direction of the intensity distribution sent from the detector 160 into 20 parts. Here, the scan direction is the direction of arrow A7 shown in FIG. 11.

Next, based on e.g. the graph shown in FIG. 8, the first control apparatus 170 determines the increment of crystal grain size for the energy density corresponding to the wave height En (see FIG. 11) of the intensity distribution with the width in the short axis direction partitioned into N parts (step S113). However, in the case where the energy density of the laser light 116 exceeds the threshold at which the crystal grain size of the polycrystalline silicon film 213 takes a downward turn (approximately 390-410 mJ/cm² in the example shown in FIG. 8), the first control apparatus 170 sets to 0 the increment of crystal grain size summed before the energy density of the laser light 116 exceeds the threshold (step S113).

Next, the first control apparatus 170 sums the increments of crystal grain size by the number of scans N (step S115). That is, by the algorithm shown in step S113 and step S115, when the energy density of the laser light 116 exceeds the threshold, the first control apparatus 170 sets to 0 the increment of crystal grain size summed so far and restarts summing the increment of crystal grain size from the beginning.

Next, in the case where the summed total crystal grain size is smaller than the desired minimum grain size of the polycrystalline silicon film 213 (e.g., approximately 0.1-0.3 μm), the first control apparatus 170 determines that the crystal grain size of the polycrystalline silicon film 213 is abnormal (step S117). The first control apparatus 170 sends a signal of abnormality determination to the second control apparatus 180. Then, the second control apparatus 180 controls a prescribed action such as stopping the laser annealing apparatus 100 (step S117).

In this embodiment, the first control apparatus 170 performs a defectiveness determination on the crystal grain size of the polycrystalline silicon film 213 for all the number of times of pulse irradiation (e.g., 20 times). However, this embodiment is not limited thereto. The first control apparatus 170 may perform a defectiveness determination on the crystal grain size of the polycrystalline silicon film 213 for a reduced number of times of pulse irradiation (e.g., 10 times).

The algorithm in the first control apparatus 170 and the second control apparatus 180 may be performed either on-line or off-line. More specifically, the second control apparatus 180 may simultaneously or immediately perform e.g. the aforementioned prescribed action based on the signal of the detection result or determination result sent from the first control apparatus 170 during the laser annealing process. Alternatively, the second control apparatus 180 may store the detection result or determination result sent from the first control apparatus 170, and then perform e.g. the aforementioned prescribed action based on the stored result during the interim between the laser annealing processes.

Figure 12A:
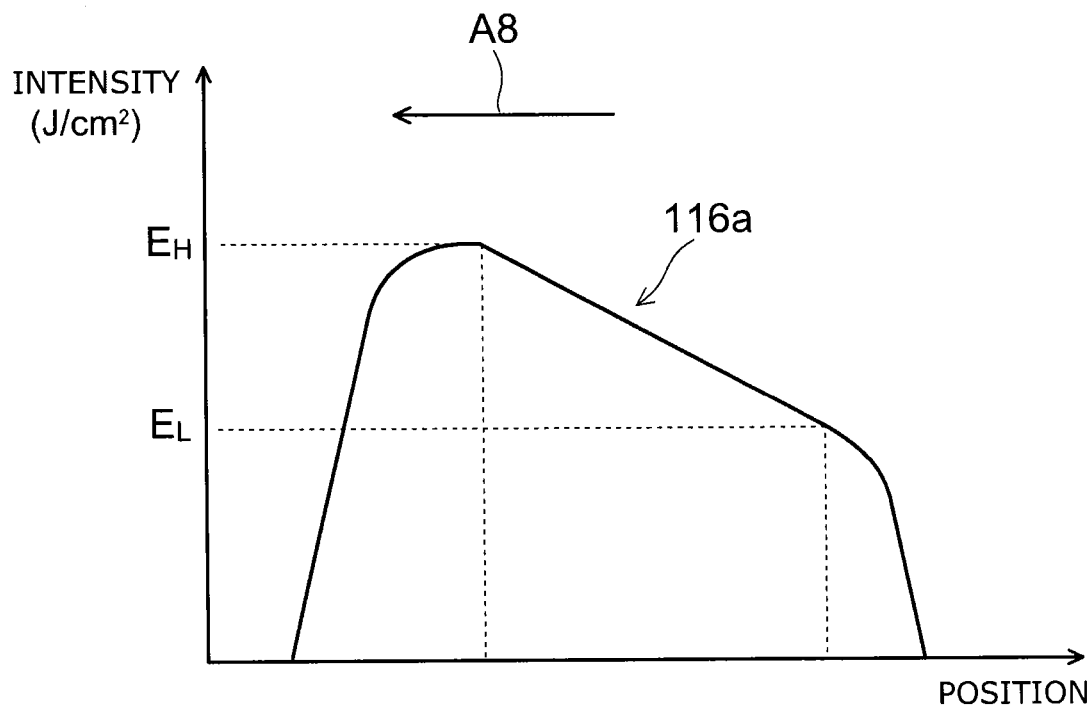
FIGS. 12A and 12B are graphs describing an alternative laser annealing method according to this embodiment.
Figure 12B:
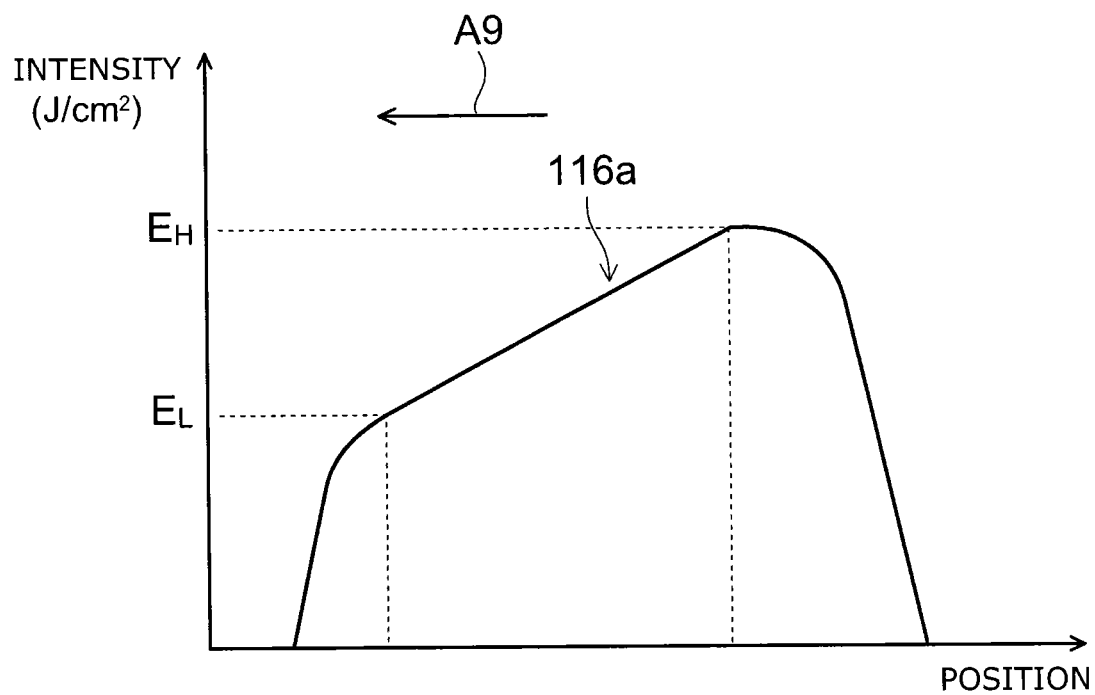

FIGS. 12A and 12B are graphs describing an alternative laser annealing method according to this embodiment.

The horizontal axis and vertical axis of the graphs shown in FIGS. 12A and 12B are similar to the horizontal axis and vertical axis of the graph shown in FIG. 4, respectively.

In the laser annealing method according to this embodiment, as shown in FIGS. 12A and 12B, in the case where the intensity in the plateau 116a of the intensity distribution in the short axis direction sent from the detector 160 is gradually decreased, the first control apparatus 170 determines that the crystal grain size of the polycrystalline silicon film 213 is abnormal when the condition represented by the following formula holds. Here, arrow A8 shown in FIG. 12A and arrow A9 shown in FIG. 12B represent the moving direction of the mounting stage 150.

$$E_{th} = E_L/E_H < 0.65$$

That is, in the case where the ratio of minimum intensity $E_L$ to maximum intensity $E_H$ in the plateau 116a is smaller than a prescribed value (here 0.65), the first control apparatus 170 determines that the crystal grain size of the polycrystalline silicon film 213 is abnormal.

The threshold at which the first control apparatus 170 determines that the crystal grain size of the polycrystalline silicon film 213 is abnormal is not limited to 0.65, but may be e.g. approximately 0.4-0.7.

The algorithm shown in FIGS. 12A and 12B may be performed as a previous stage of the algorithm for performing a calculation of crystal grain size or a defectiveness determination on the crystal grain size (e.g., the algorithm described above with reference to FIG. 10).

More specifically, in the case where the ratio of minimum intensity $E_L$ to maximum intensity $E_H$ in the plateau 116a is smaller than a prescribed value, the first control apparatus 170 determines that the intensity distribution in the short axis direction of the laser light 116 is abnormal. When the first control apparatus 170 determines that the intensity distribution in the short axis direction of the laser light 116 is abnormal, the first control apparatus 170 does not perform the algorithm for performing a calculation of crystal grain size or a defectiveness determination on the crystal grain size.

On the other hand, in the case where the ratio of minimum intensity $E_L$ to maximum intensity $E_H$ in the plateau 116a is larger than or equal to the prescribed value, the first control apparatus 170 determines that the intensity distribution in the short axis direction of the laser light 116 is normal. When the first control apparatus 170 determines that the intensity distribution in the short axis direction of the laser light 116 is normal, the first control apparatus 170 subsequently performs the algorithm for performing a calculation of crystal grain size or a defectiveness determination on the crystal grain size.

This can reduce the calculation load on the first control apparatus 170.

Figure 13:
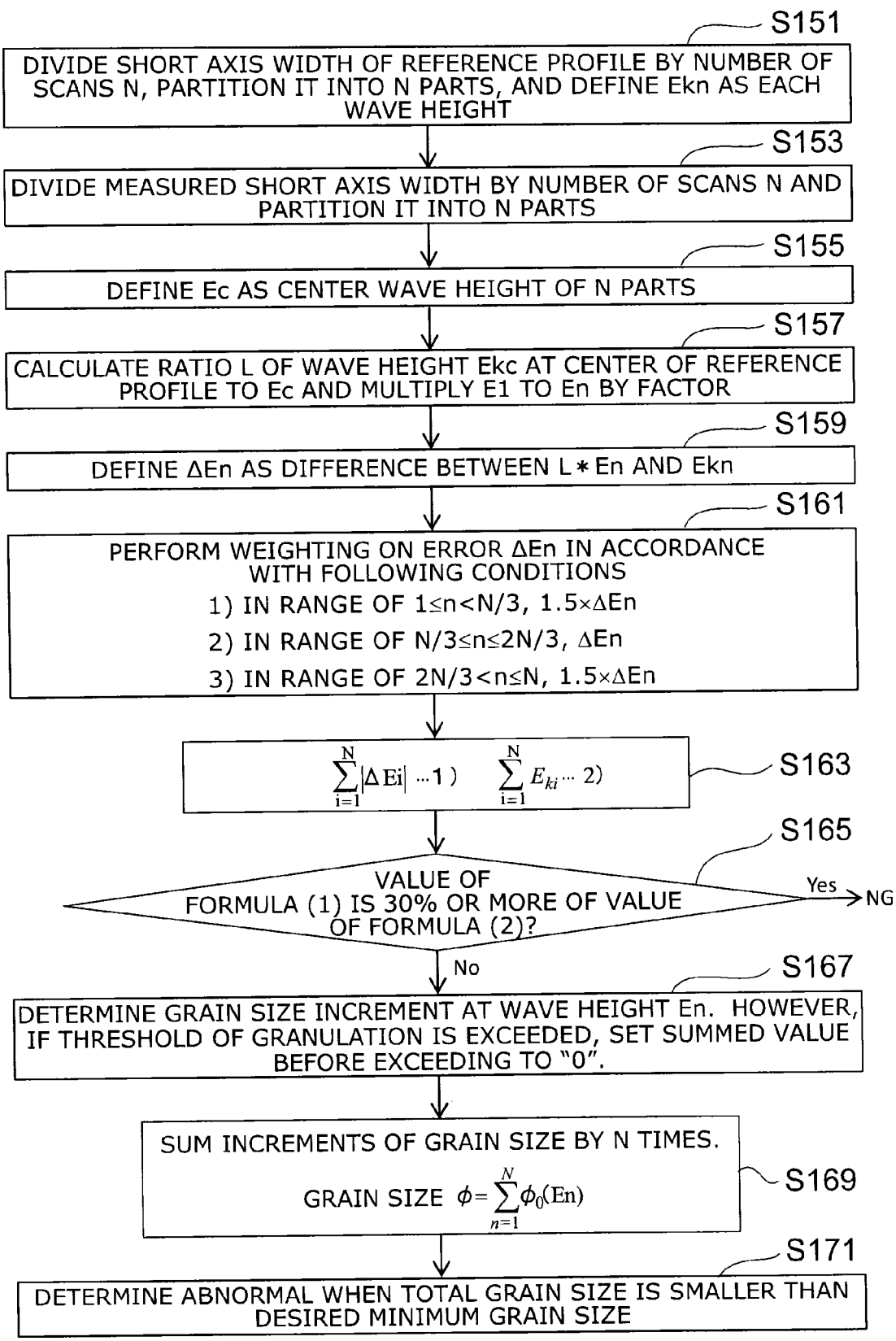
FIG. 13 is a flow chart describing a further alternative laser annealing method according to this embodiment.

FIG. 13 is a flow chart describing a further alternative laser annealing method according to this embodiment.

Figure 14:
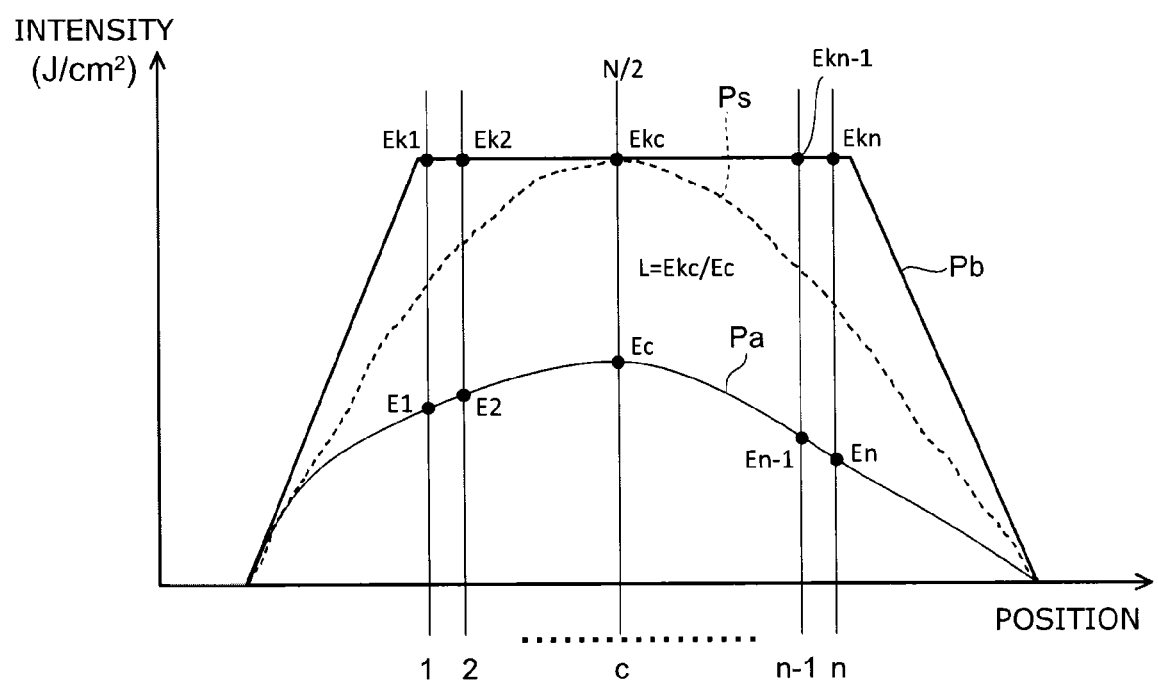
FIG. 14 is a graph illustrating an example of the intensity distribution in the short axis direction of the laser light.

FIG. 14 is a graph illustrating an example of the intensity distribution in the short axis direction of the laser light.

The horizontal axis and vertical axis of the graph shown in FIG. 14 are similar to the horizontal axis and vertical axis of the graph shown in FIG. 4, respectively.

In the laser annealing method according to this embodiment, the first control apparatus 170 performs a defectiveness determination on the intensity distribution of the laser light 116 as a previous stage of performing a calculation of crystal grain size or a defectiveness determination on the crystal grain size.

More specifically, as in the flow chart shown in FIG. 13, first, the first control apparatus 170 divides the width in the short axis direction of a reference profile Pb by the number of scans N, and partitions it into N parts (step S151). The number of scans N is defined as described above with reference to FIG. 11. As shown in FIG. 14, the first control apparatus 170 defines Ekn as each wave height of the intensity distribution with the width in the short axis direction of the reference profile Pb partitioned into N parts (step S151). Furthermore, the first control apparatus 170 defines Ekc as the wave height at the center of the intensity distribution with the width in the short axis direction of the reference profile Pb partitioned into N parts.

Next, the first control apparatus 170 divides the width in the short axis direction of the intensity distribution sent from the detector 160 (actual measured profile Pa) by the number of scans N, and partitions it into N parts (step S153). As shown in FIG. 14, the first control apparatus 170 defines Ec as the wave height at the center of the intensity distribution with the width in the short axis direction of the measured profile Pa partitioned into N parts (step S155). Furthermore, the first control apparatus 170 defines En as each wave height of the intensity distribution with the width in the short axis direction of the measured profile Pa partitioned into N parts.

Next, the first control apparatus 170 calculates the ratio L (Ekc/Ec) of the wave height Ekc at the center of the reference profile Pb to the wave height Ec at the center of the measured profile Pa. Then, the first control apparatus 170 multiplies each of E1 to En by the factor L. As shown in FIG. 14, this results in a profile (normalized profile) Ps in which the wave height Ekc at the center of the reference profile Pb is matched with the wave height Ec at the center of the measured profile Pa, with the measured profile Pa multiplied by L.

Next, the first control apparatus 170 defines ΔEn as the difference between L×En and Ekn (step S159), and performs weighting on the error ΔEn (step S161). More specifically, in the range of n satisfying the condition 1≤n<N/3, the first control apparatus 170 calculates 1.5×ΔEn. In the range of n satisfying the condition N/3≤n≤2N/3, the first control apparatus 170 leaves ΔEn unchanged. In the range of n satisfying the condition 2N/3<n≤N, the first control apparatus 170 calculates 1.5×ΔEn. The range of n is not limited to a prescribed range, the control apparatus 170 performing weighting of the range of n. Furthermore, the value is not limited to 1.5, the control apparatus 170 multiplying the error ΔEn by the value as weighting.

Next, the first control apparatus 170 calculates the following formulas (step S163).

[Equation 1]

$$\sum_{i=1}^{N} |\Delta Ei| \tag{1}$$

[Equation 2]

$$\sum_{i=1}^{N} E_{ki} \tag{2}$$

Next, the first control apparatus 170 determines whether the value of formula (1) is 30% or more of the value of formula (2) (step S165). In the case where the value of formula (1) is 30% or more of the value of formula (2) (step S165, Yes), the first control apparatus 170 determines that the intensity distribution in the short axis direction of the laser light 116 is abnormal. Then, the first control apparatus 170 does not perform the algorithm for performing a calculation of crystal grain size or a defectiveness determination on the crystal grain size (NG).

On the other hand, in the case where the value of formula (1) is not 30% or more of the value of formula (2) (step S165, No), the first control apparatus 170 determines that the intensity distribution in the short axis direction of the laser light 116 is normal. Then, the first control apparatus 170 performs the algorithm for performing a calculation of crystal grain size or a defectiveness determination on the crystal grain size. That is, the first control apparatus 170 performs an algorithm similar to steps S113-S117 described above with reference to FIG. 10 (steps S167-S171).

Figure 15:
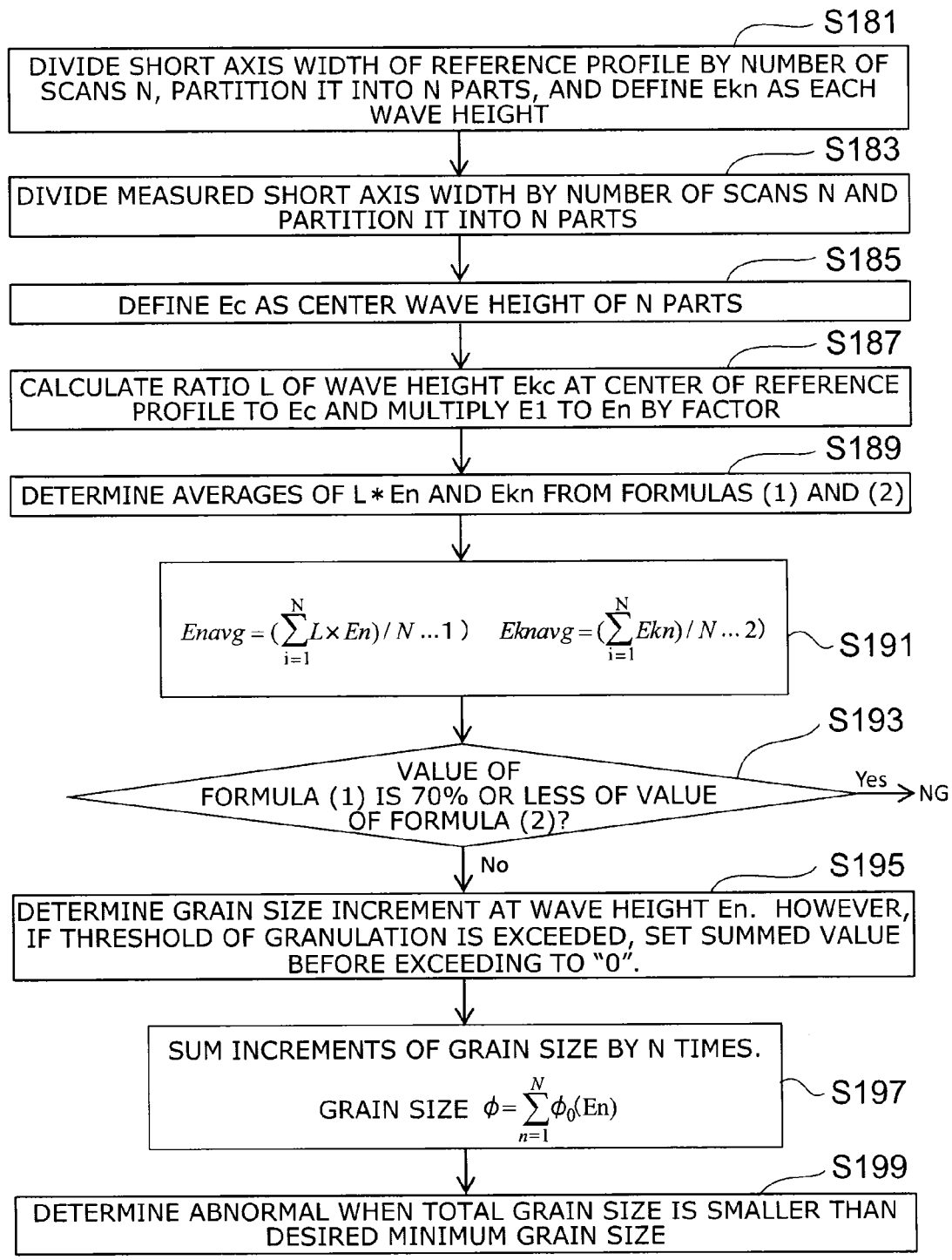
FIG. 15 is a flow chart describing a further alternative laser annealing method according to this embodiment.

FIG. 15 is a flow chart describing a further alternative laser annealing method according to this embodiment.

It is assumed that the intensity distribution in the short axis direction of the laser light is similar to the example illustrated in FIG. 14.

As in the laser annealing method described above with reference to FIGS. 13 and 14, in the laser annealing method according to this embodiment, the first control apparatus 170 performs a defectiveness determination on the intensity distribution of the laser light 116 as a previous stage of performing a calculation of crystal grain size or a defectiveness determination on the crystal grain size.

First, the first control apparatus 170 performs an algorithm similar to steps S151-S157 described above with reference to FIG. 13 (steps S181-S187). Next, the first control apparatus 170 determines the average Enavg of the wave heights L×En from formula (3), and determines the average Eknavg of the wave heights Ekn from formula (4) (step S189 and step S191).

[Equation 3]

$$Enavg = \left(\sum_{i=1}^{N} L \times En\right) / N \tag{3}$$

[Equation 4]

$$Eknavg = \left(\sum_{i=1}^{N} Enk\right) / N \tag{4}$$

Next, the first control apparatus 170 determines whether the value (Enavg) of formula (3) is 70% or less of the value (Eknavg) of formula (4) (step S193). In the case where the value of formula (3) is 70% or less of the value of formula (4) (step S193, Yes), the first control apparatus 170 determines that the intensity distribution in the short axis direction of the laser light 116 is abnormal. Then, the first control apparatus 170 does not perform the algorithm for performing a calculation of crystal grain size or a defectiveness determination on the crystal grain size (NG).

On the other hand, in the case where the value of formula (3) is not 70% or less of the value of formula (4) (step S193, No), the first control apparatus 170 determines that the intensity distribution in the short axis direction of the laser light 116 is normal. Then, the first control apparatus 170 performs the algorithm for performing a calculation of crystal grain size or a defectiveness determination on the crystal grain size. That is, the first control apparatus 170 performs an algorithm similar to steps S113-S117 described above with reference to FIG. 10 (steps S195-S199).

In the laser annealing methods described above with reference to FIGS. 13 to 15, the first control apparatus 170 performs a defectiveness determination on the intensity distribution of the laser light 116 as a previous stage of performing a calculation of crystal grain size or a defectiveness determination on the crystal grain size. When the first control apparatus 170 determines that the intensity distribution is abnormal, the first control apparatus 170 does not perform the algorithm for performing a calculation of crystal grain size or a defectiveness determination on the crystal grain size. This can reduce the calculation load on the first control apparatus 170.

In the laser annealing methods described above with reference to FIGS. 13 to 15, the first control apparatus 170 determines a normalized profile Ps by matching the wave height Ekc at the center of the reference profile Pb with the wave height Ec at the center of the measured profile Pa. However, the method for determining the normalized profile Ps is not limited thereto. For instance, the first control apparatus 170 may determine a normalized profile Ps by matching the integrated value of the reference profile Pb with the integrated value of the measured profile Pa.

Figure 16:
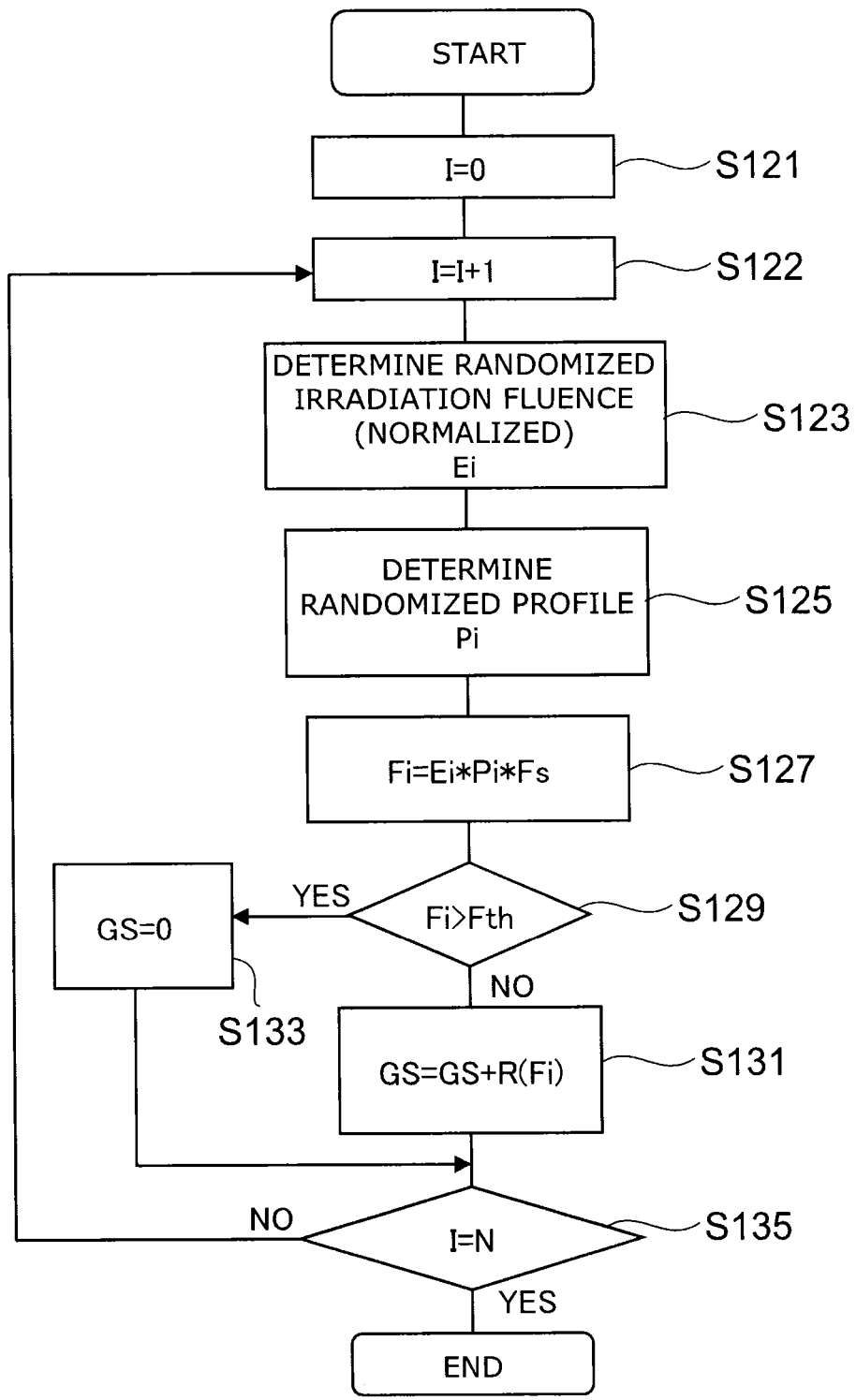
FIG. 16 is a flow chart describing a further alternative laser annealing method according to this embodiment.

FIG. 16 is a flow chart describing a further alternative laser annealing method according to this embodiment.

Figure 17:
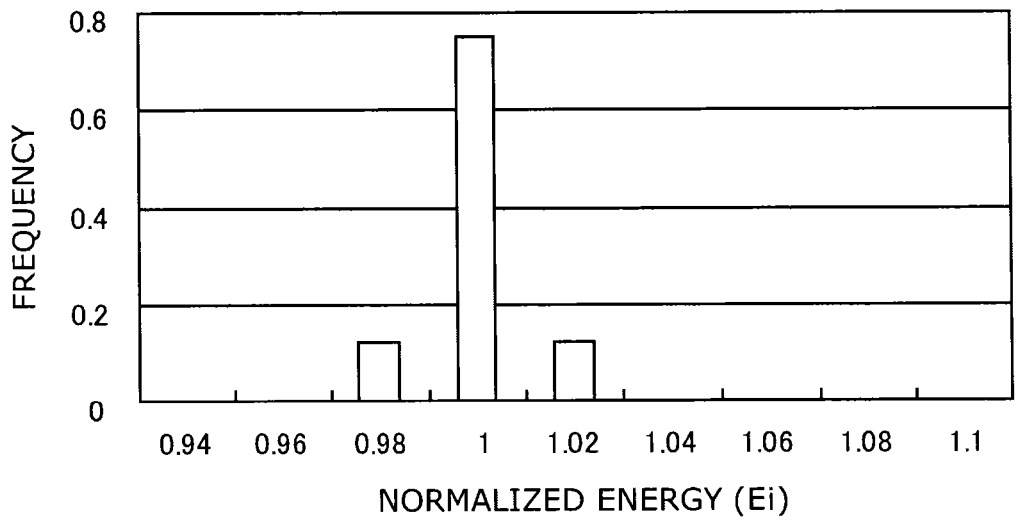
FIG. 17 is a graph illustrating the frequency distribution of variations of the energy of the laser light.

FIG. 17 is a graph illustrating the frequency distribution of variations of the energy of the laser light.

Figure 18:
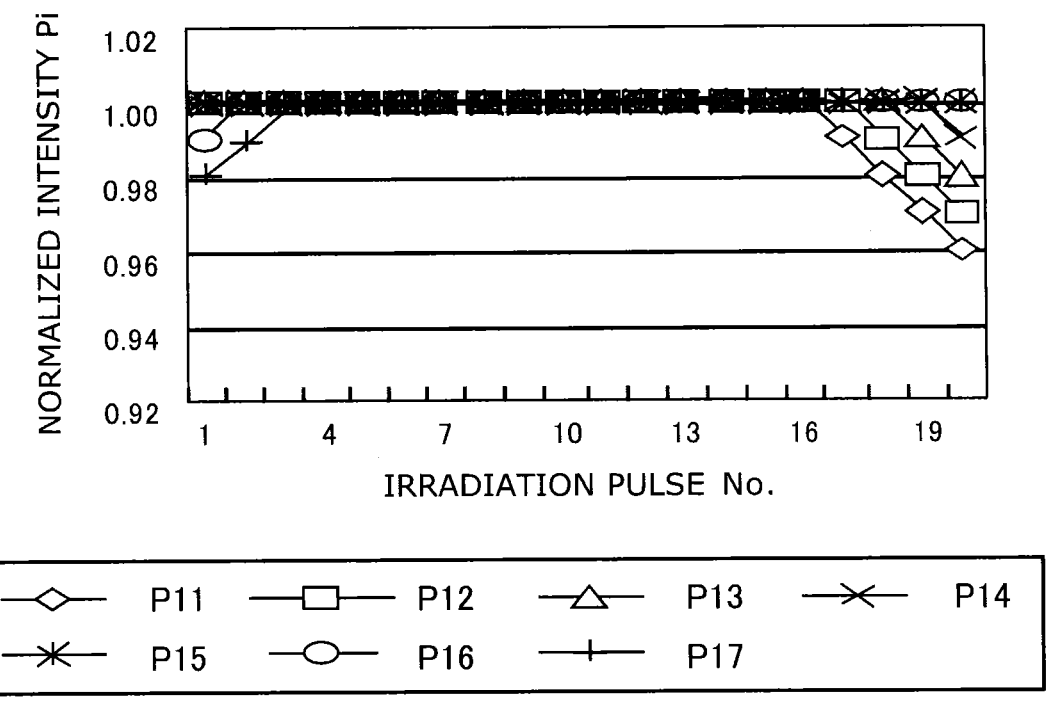
FIG. 18 is a graph illustrating an example of the intensity distribution in the short axis direction of the laser light of this embodiment.

FIG. 18 is a graph illustrating an example of the intensity distribution in the short axis direction of the laser light of this embodiment.

Figure 19:
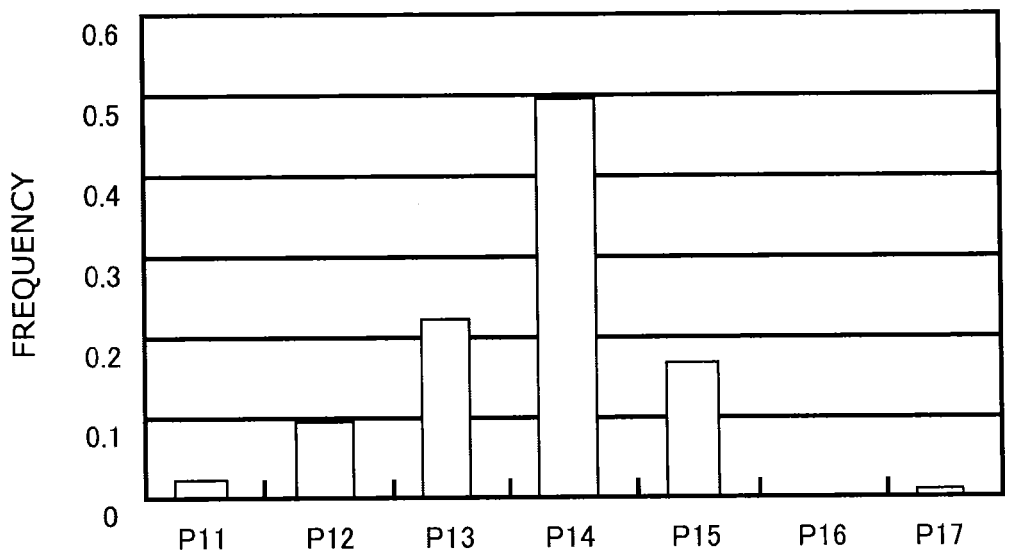
FIG. 19 is a graph illustrating an example of the frequency distribution of variations in the short axis direction of the laser light of this embodiment.

FIG. 19 is a graph illustrating an example of the frequency distribution of variations in the short axis direction of the laser light of this embodiment.

In the laser annealing method according to this embodiment, if the profile shape in the short axis direction of the laser light 116 and the energy density of the laser light 116 are found, the crystal grain size can be estimated. Thus, the process margin of the irradiation energy density can be estimated.

First, as in e.g. the graph shown in FIG. 17, the variation rate of the energy of the irradiating laser light 116 and its occurrence probability are measured. Furthermore, as in e.g. the graphs shown in FIGS. 18 and 19, the variation rate of the profile shape in the short axis direction of the laser light 116 and its occurrence probability are measured. Thus, the variation rate of the energy of the laser light 116 and its occurrence probability, and the variation rate of the profile shape in the short axis direction of the laser light 116 and its occurrence probability are measured in advance. Next, the energy density and the profile shape with the variation taken into consideration in accordance with the occurrence probability are determined. The increment of crystal grain size corresponding thereto is determined based on e.g. the graph shown in FIG. 8.

More specifically, as shown in FIG. 16, first, the initial value of irradiation number I is set to 0 (step S121). Then, the irradiation number I is added with 1 (step S122). Next, as in e.g. the graph shown in FIG. 17, a randomized normalized irradiation fluence Ei is determined with the variation taken into consideration in accordance with the variation rate of the energy of the laser light 116 and its occurrence probability measured previously (step S123). Furthermore, as in e.g. the graphs shown in FIGS. 18 and 19, a randomized profile Pi is determined with the variation taken into consideration in accordance with the variation rate of the profile shape in the short axis direction of the laser light 116 and its occurrence probability measured previously (step S125).

Next, an irradiation fluence Fi is calculated by multiplying the normalized irradiation fluence Ei determined by step S123, the profile Pi determined by step S125, and a preset fluence Fs (step S127). Then, it is determined whether the irradiation fluence Fi is larger than a granulation threshold fluence (the threshold at which the crystal grain size takes a downward turn) Fth (step S129).

In the case where the irradiation fluence Fi is smaller than the granulation threshold fluence Fth (step S129, NO), the increment R(Fi) of crystal grain size for the irradiation fluence Fi is determined based on e.g. the graph shown in FIG. 8, and added to the increment of grain size GS so far (step S131). On the other hand, in the case where the irradiation fluence Fi is larger than the granulation threshold fluence Fth (step S129, YES), the increment of crystal grain size GS summed before the irradiation fluence Fi exceeds the granulation threshold fluence Fth is set to 0 (step S133).

Next, it is determined whether the irradiation number I is equal to the number of times of irradiation N (e.g., 20) (step S135). In the case where the irradiation number I is equal to the number of times of irradiation N (step S135, YES), the algorithm of this embodiment is ended. On the other hand, in the case where the irradiation number I is not equal to the number of times of irradiation N (step S135, NO), the operation described above with reference to step S122 is performed.

In the laser annealing method of this embodiment, the margin of energy density of the laser light 116 for the profile shape in the short axis direction of the laser light 116 can be determined. Furthermore, the loop count of the algorithm shown in FIG. 16 is equal to the number of times of irradiation N, or irradiation pitch. Thus, an appropriate irradiation pitch for the crystal grain size can be estimated by the same algorithm.

Furthermore, in the laser annealing method of this embodiment, for instance, in an apparatus different from the laser annealing apparatus described above with reference to FIGS. 1 and 2, the margin of energy density and the irradiation pitch can be calculated and estimated. Thus, calculation can be performed off-line. Furthermore, the measurement described above with reference to FIGS. 17 to 19 can be performed independently. Then, these calculation results (data) can be incorporated into the on-line algorithm and determination value.

Next, a method for manufacturing a thin film transistor according to this embodiment is described with reference to the drawings.

Figure 20:
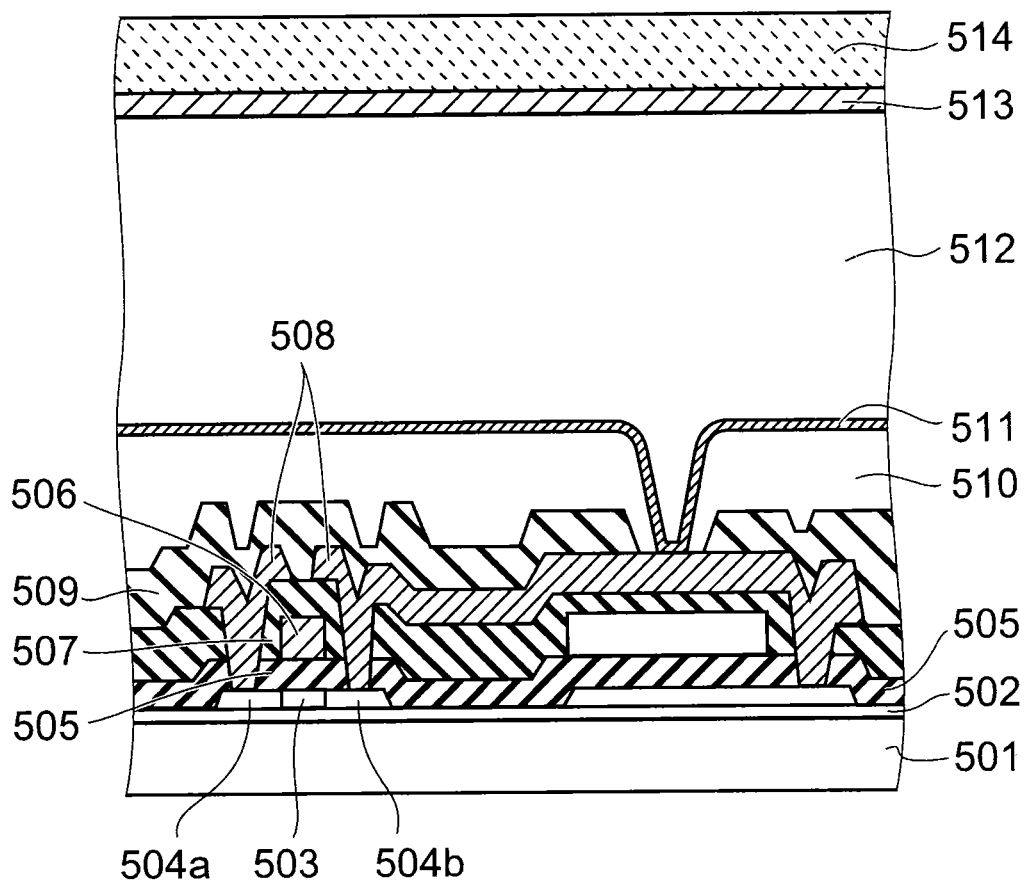
FIG. 20 is a schematic sectional view illustrating an active matrix liquid crystal display device.

FIG. 20 is a schematic sectional view illustrating an active matrix liquid crystal display device.

In the method for manufacturing a thin film transistor according to this embodiment, by using the laser annealing apparatus 100 and the laser annealing method described above with reference to FIGS. 1 to 19, a non-crystalline silicon film 211 formed on the surface of a substrate 220 is irradiated with laser light 116 and turned into a polycrystalline silicon film 213. Then, by photolithography technique, a thin film transistor is fabricated. The thin film transistor is used to manufacture an active matrix liquid crystal display device.

The active matrix liquid crystal display device shown in FIG. 20 includes a glass substrate 501, an opposite glass substrate 514 opposed to the glass substrate 501, and a liquid crystal 512 interposed between the glass substrate 501 and the opposite glass substrate 514. The glass substrate 501 includes an insulated gate thin film transistor (TFT), a color filter 510, and a pixel electrode 511. The opposite glass substrate 514 includes an opposite electrode 513.

On the surface of the glass substrate 501, an undercoat layer 502 is formed. On the undercoat layer 502, a non-crystalline silicon film is formed, and modified into a polycrystalline silicon film by the laser annealing apparatus 100 and the laser annealing method described above with reference to FIGS. 1 to 19.

A TFT is formed from the polycrystalline silicon film obtained by laser annealing. More specifically, both sides of a semiconductor layer 503 made of polycrystalline silicon are doped with impurity to form a polycrystalline silicon source layer 504a and a polycrystalline silicon drain layer 504b. On the polycrystalline silicon source layer 504a and the polycrystalline silicon drain layer 504b, a gate electrode 506 is formed via a gate oxide film 505.

Source/drain electrodes 508 are connected to the polycrystalline silicon source layer 504a and the polycrystalline silicon drain layer 504b, respectively, through connection holes formed in an interlayer insulating film 507. On the source/drain electrodes 508, a protective film 509 is provided. Furthermore, a color filter 510 and a pixel electrode 511 are formed.

According to this embodiment, by using the laser annealing apparatus 100 and the laser annealing method described above with reference to FIGS. 1 to 19, a TFT having superior characteristics can be produced in large volumes. Thus, a high-quality liquid crystal display device can be fabricated with higher yield.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A laser annealing method, comprising:
   irradiating a non-crystalline thin film with laser light emitted from a laser apparatus, the laser light being formed as a line beam by a line beam optical system;
   detecting an intensity distribution of the laser light;
   dividing a width in a short axis direction of the line beam in the intensity distribution by a number of scans and partitioning the width by the number of scans, the number of scans being a number of times of pulse irradiation per one site of the non-crystalline thin film, the short axis direction being a direction of the scan of the line beam;
   calculating increment of crystal grain size of the non-crystalline thin film for energy density of the laser light corresponding to wave height of the intensity distribution in which the width is partitioned by the number of scans, and summing the increments by the number of scans,
   setting an increment summed before the energy density exceeds a threshold to zero when the energy density is larger than the threshold, the threshold being the energy density at which the crystal grain size of the non-crystalline thin film takes a downward turn; and
   modifying the non-crystalline thin film by irradiating with the laser light.

2. The method according to claim 1, wherein when total crystal grain size with the increments summed by the number of times of pulse irradiation is smaller than a prescribed crystal grain size, it is determined that the crystal grain size of the non-crystalline thin film is abnormal.

3. The method according to claim 2, wherein when the determination of abnormality is made, control for an action including at least one of changing incident angle of the laser light on the line beam optical system, raising an alarm, and stopping the apparatus is performed.

4. The method according to claim 1, further comprising:
   between the partitioning and the summing, normalizing the detected intensity distribution using a reference intensity distribution, and determining whether total of absolute values of differences between wave heights of the normalized intensity distribution partitioned by the partitioning and wave heights of the reference intensity distribution partitioned by the partitioning accounts for a prescribed ratio or more with respect to total of the wave heights of the normalized intensity distribution partitioned by the partitioning.

5. The method according to claim 4, wherein weighting is performed on the absolute value of difference in a prescribed range in the short axis direction of the partitioned intensity distribution.

6. The method according to claim 4, wherein the summing is performed when the total of absolute values of differences between wave heights of the normalized intensity distribution partitioned by the partitioning and wave heights of the reference intensity distribution partitioned by the partitioning does not account for the prescribed ratio or more with respect to the total of the wave heights of the normalized intensity distribution partitioned by the partitioning.

7. The method according to claim 1, further comprising:
   between the partitioning and the summing, normalizing the detected intensity distribution using a reference intensity distribution, and determining whether average of wave heights of the normalized intensity distribution partitioned by the partitioning accounts for a prescribed ratio or less with respect to average of wave heights of the reference intensity distribution partitioned by the partitioning.

8. The method according to claim 7, wherein the summing is performed when the average of wave heights of the normalized intensity distribution partitioned by the partitioning does not account for the prescribed ratio or less with respect to the average of wave heights of the reference intensity distribution partitioned by the partitioning.

9. A method for manufacturing a thin film transistor, comprising:
   using a laser annealing method including:
      irradiating a non-crystalline thin film with laser light emitted from a laser apparatus, the laser light being formed as a line beam by a line beam optical system;
      detecting an intensity distribution of the laser light;

dividing a width in a short axis direction of the line beam in the intensity distribution by a number of scans and partitioning the width by the number of scan, the number of scans being a number of times of pulse irradiation per one site of the non-crystalline thin film, the short axis direction being a direction of the scan of the line beam;

calculating increment of crystal grain size of the non-crystalline thin film for energy density of the laser light corresponding to wave height of the intensity distribution in which the width is partitioned by the number of scan, and summing the increments by the number of scan, setting an increment summed before the energy density exceeds a threshold to zero when the energy density is larger than the threshold, the threshold being the energy density at that the crystal grain size of the non-crystalline thin film takes a downward turn;

modifying the non-crystalline thin film by irradiating with the laser light; and turning the non-crystalline thin film into a semiconductor layer.

10. The method according to claim 9, wherein in the laser annealing method, when total crystal grain size with the increments summed by the number of times of pulse irradiation is smaller than a prescribed crystal grain size, it is determined that the crystal grain size of the non-crystalline thin film is abnormal.

11. The method according to claim 10, wherein in the laser annealing method, when the determination of abnormality is made, control for an action including at least one of changing incident angle of the laser light on the line beam optical system, raising an alarm, and stopping the apparatus is performed.

12. The method according to claim 9, wherein the laser annealing method further includes, between the partitioning and the summing, normalizing the detected intensity distribution using a reference intensity distribution, and determining whether total of absolute values of differences between wave heights of the normalized intensity distribution partitioned by the partitioning and wave heights of the reference intensity distribution partitioned by the partitioning accounts for a prescribed ratio or more with respect to total of the wave heights of the normalized intensity distribution partitioned by the partitioning.

13. The method according to claim 9, wherein the laser annealing method further includes, between the partitioning and the summing, normalizing the detected intensity distribution using a reference intensity distribution, and determining whether average of wave heights of the normalized intensity distribution partitioned by the partitioning accounts for a prescribed ratio or less with respect to average of wave heights of the reference intensity distribution partitioned by the partitioning.

* * * * *